US007080006B1

(12) United States Patent
Kupferschmidt et al.

(10) Patent No.: US 7,080,006 B1
(45) Date of Patent: Jul. 18, 2006

(54) METHOD FOR DECODING DIGITAL AUDIO WITH ERROR RECOGNITION

(75) Inventors: Claus Kupferschmidt, Lechstedt (DE); Torsten Mlasko, Pattensen (DE); Marc Klein Middelink, Huissen (NL)

(73) Assignee: Robert Bosch GmbH, Stuttgart (DE)

( * ) Notice: Subject to any disclaimer, the term of this patent is extended or adjusted under 35 U.S.C. 154(b) by 491 days.

(21) Appl. No.: 10/149,317

(22) PCT Filed: Nov. 7, 2000

(86) PCT No.: PCT/DE00/03896

§ 371 (c)(1),
(2), (4) Date: Mar. 20, 2003

(87) PCT Pub. No.: WO01/43320

PCT Pub. Date: Jun. 14, 2001

(30) Foreign Application Priority Data

Dec. 8, 1999 (DE) ................................ 199 59 038

(51) Int. Cl.

| | |
|---|---|
| ***G10L 19/02*** | (2006.01) |
| ***G10L 21/02*** | (2006.01) |
| ***G06F 11/00*** | (2006.01) |
| ***G08C 25/00*** | (2006.01) |
| ***H03M 13/00*** | (2006.01) |
| ***H04L 1/00*** | (2006.01) |

(52) U.S. Cl. .................... 704/200.1; 704/206; 704/500; 714/746

(58) Field of Classification Search ............. 704/200.1, 704/224, 226, 228, 229, 206, 500; 714/745, 714/746, 747

See application file for complete search history.

(56) References Cited

U.S. PATENT DOCUMENTS

| | | | | |
|---|---|---|---|---|
| 4,831,624 | A | 5/1989 | McLaughlin et al. | |
| 5,091,945 | A * | 2/1992 | Kleijn | 704/219 |
| 5,694,522 | A * | 12/1997 | Hiratsuka et al. | 704/265 |
| 5,706,396 | A | 1/1998 | Schroder et al. | |
| 5,768,281 | A * | 6/1998 | Takano | 370/503 |
| 6,208,959 | B1 * | 3/2001 | Jonsson et al. | 704/209 |
| 6,233,708 | B1 * | 5/2001 | Hindelang et al. | 714/747 |
| 6,356,601 | B1 * | 3/2002 | Chen et al. | 375/340 |
| 6,728,323 | B1 * | 4/2004 | Chen et al. | 375/340 |
| 7,003,448 | B1 * | 2/2006 | Lauber et al. | 704/200.1 |

* cited by examiner

FOREIGN PATENT DOCUMENTS

DE 44 09 960 9/1995

OTHER PUBLICATIONS

D. Wiese, "Optimization of Error Detection and Concealment for ISO/MPEG/Audio Codes Layer-I and II", Preprints of Papers Presented at the AES Convention, Nr. 3388, 1992, pp. 1-29.

*Primary Examiner*—Martin Lerner
(74) *Attorney, Agent, or Firm*—Kenyon & Kenyon LLP

(57) ABSTRACT

A method is provided for the decoding of digital audio data, which is used to perform an error recognition dependent on transmitted reference values, e.g., scale factors. The method includes the comparison of reference values of a subband with preceding reference values of the same subband, in order to produce a characteristic that is compared with a threshold value, and that, if the characteristic is located above the predetermined threshold value, this is indicated by a signaling. In an example embodiment of the present invention, it is provided that in subbands in which no audio data are transmitted a default value is entered, which leads to the result that no characteristic is produced for this subband.

10 Claims, 1 Drawing Sheet

METHOD FOR DECODING DIGITAL AUDIO WITH ERROR RECOGNITION

FIELD OF THE INVENTION

The present invention relates to a method for decoding digital audio data.

BACKGROUND INFORMATION

It is conventional that, in DAB (Digital Audio Broadcasting), at the transmission side the overall frequency spectrum of the digital audio signals to be transmitted is divided into frequency ranges. These frequency ranges are called subbands. Per subband, a maximum of 3 scale factors are defined as reference values. In each subband, in the case of stereo transmissions 36 sampling values are produced in chronologically successive fashion per channel. The 36 sampling values are divided into groups, chronologically separated from one another, of 12 sampling values each. Per group, a maximum of one scale factor is defined. If two, or all three, scale factors of a subband are equal, or at least with very similar values, then only one scale factor is transmitted for the scale factors. Within a DAB frame in which the sampling values and their scale factors are transmitted, it is thus signaled for which group or groups of sampling values for a subband a respective scale factor is to be used. In each group or groups of sampling values, the scale factors have the largest signal power value. The remaining signal values in this group or in these groups are normed to this scale factor.

In the receiver, error recognition and correction methods are then performed during the source decoding, after such methods have been executed in a preceding channel decoding. These error recognition and correction methods during the source decoding relate both to the DAB frames and to the scale factors. The digital audio data are then denormed using the scale factors, and a decoding of the audio data occurs.

In U.S. Pat. No. 5,706,396, a comparison of the transition of scale factors in the decoding is described. Here, a threshold value comparison, a comparison with an expected transition, or a polarity comparison is performed. German Published Patent Application No. 44 09 960 refers to determining error recognition in digital audio data, given scale factors, using a check sum, i.e., CRC, and to using error masking measures dependent on this error recognition. In U.S. Pat. No. 4,831,624, an error recognition using CRC is described.

SUMMARY

The method according to the present invention for decoding digital audio data may provide the advantage that by a plausibility test an error is recognized, and error correction or masking methods are then introduced. The method uses the characteristic of audio data that no large jumps occur in their chronological curve. For this reason, formation of a comparison of chronologically successive reference values that depend on the audio data advantageously leads to a diagnostically effective result as to whether an error is present or not.

The method according to the present invention may be implemented in all audio decoders. In addition, the method according to the present invention is applicable to further audio decoding methods (standards). These standards include MPEG-1, MPEG-2, and MPEG-4. The standards may include their own error determination system or not.

In addition, it may be advantageous that a multistage error recognition is performed, because in addition to the above-cited error recognition and correction methods, for example in the case of DAB, an additional method is included in order to detect additional errors.

Advantageously, in the method according to the present invention a close correlation between the reference values, which in the case of DAB are scale factors, is exploited in order to determine whether an error is present. Audio data have the characteristic that chronologically adjacent data stand in close correlation with one another. This is a characteristic of speech and music.

It may be advantageous that the characteristic is determined by a difference value formation or mean value formation, through which a diagnostically effective, easily surveyable, and simple decision is made as to whether an error is present or not. Moreover, the method according to the present invention is thus independent of a signal type, because the calculation method may be used that is optimal for a particular signal.

In addition, it may be advantageous that the signaling of the decision as to whether an error is present occurs by a bit sequence, e.g., a flag, enabling a simple evaluation of this decision.

In addition, it may be advantageous that by a linking of the evaluation of the characteristic and the error recognition of the reference values, an overall statement is made, whereby the evaluation of the characteristic is given an excess weight, because here a relevant relation between chronologically successive reference values is exploited, namely a close correlation between the audio data.

In addition, it may be advantageous that in addition to the reference values, e.g., the scale factors, frames that are used for the transmission of the digital audio data also have an error recognition. In this manner, a double protection against error is realized in a simple manner.

In addition, it may be advantageous that when no data are transmitted in a subband, default values are entered as reference values, and these default values are then identified as such, so that the error recognition is not executed here, because otherwise an error would mistakenly be assumed.

In addition, suitable default values may be determined so that the error recognition may be performed for all frequency values. Here, default values are determined that lead to a characteristic that indicates no errors, i.e., an adaptive determination of the default values. This simplifies the method, because the special case of the default value need not be caught.

Example embodiments of the present invention are illustrated in the drawings, and are explained in more detail in the following specification.

DETAILED DESCRIPTION

Figure 1:
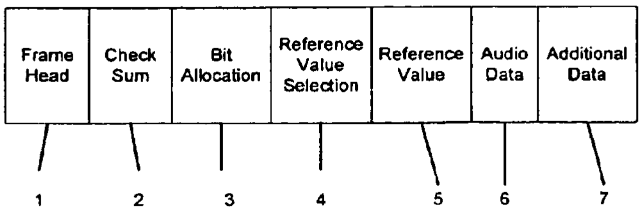
FIG. 1 illustrates an MPEG1 layer II frame.

In the digital transmission methods, such as for example DAB (Digital Audio Broadcasting), at the transmission side what are referred to as scale factors are used, designated in the following as reference values. However, below it is described that other characteristic data that depend on the audio data may also be used as reference values.

These reference values represent the strongest signal values in successive subbands, to which the remaining signal values in these subbands are normed. In this manner, the maximum difference between the amplitude of the audio signal values is reduced. In the receiver, the signal values are then denormed using the reference values, which are also transmitted.

Besides DAB, which is suitable for mobile reception of broadcast radio programs and other multimedia data, the subject matter presented here is also suitable for other digital radio transmission methods, such as DVB (Digital Video Broadcasting) and DRM (Digital Radio Mondial), or additional methods.

In digital transmission methods such as DAB, an irrelevant item is removed from the digital raw data through the source coding in the transmitter, e.g., speech data as PCM (pulse code modulation) data. In order to protect the data that are to be transmitted from transmission errors, after the source coding redundancy is again added, in a channel coding. This redundancy is used at the receiver side in order to perform an error recognition and correction during the channel decoding. In addition, a source decoding that occurs after the channel decoding also here includes an error recognition and error correction. The error recognition, and, if necessary, correction, during the source decoding is performed on the data that have already been decoded through the channel decoding. However, if a large number of errors occur, this error recognition and correction fails during the source decoding, and a poor audio quality results. Error correction is also to be understood as including an error masking in the source decoding.

In the case of digitally coded audio data, an uncorrectable error may lead to a clearly noticeable, and thus audible, error, which for the hearer is much more unpleasant than in the case of analog audio signals containing errors. This is is because in the latter case there is a smooth transition from very good audio quality to very poor audio quality, and a useful signal is still audible even given poor quality.

This is not the case for digital audio data: if the channel decoding may no longer correct all errors occurring at the receiver side, then, given DAB, first the sampling values are affected, and a gurgling disturbing noise occurs. If errors continue to occur, the scale factors, as reference values, are also affected, so that crackling disturbing noises then occur. If entire frames are repeatedly transmitted with errors, a muting occurs.

For this reason, a high value is to be placed on a reliable error recognition and correction, in order to reduce audible occurrence of errors to an absolute minimum.

According to the present invention, a characteristic is therefore generated that is suitable for an additional error protection in the source decoding, in order to determine, in a further stage, whether an error is present. The method according to the present invention is thus here based on conventional methods. This relates here to the error recognition and error correction of reference values in the source decoding. If errors are present, the reference values recognized as faulty are replaced by preceding reference values that have been stored. The reference values are then monitored for errors using two methods.

Alternatively, the method according to the present invention may also act as a sole error recognition method in the decoding of the digital audio data, because it is independent of other error recognition methods and of the frame structure.

FIG. 1 illustrates an MPEG-1 layer II frame. The MPEG-1 layer II frame begins with a frame head 1, followed by a field 2 for a frame error recognition. Here, a check sum, called a cyclic redundancy check, is used. If a faulty frame is recognized on the basis of the check sum, a suitable frame will replace the faulty frame; for example, the preceding frame may be used, or a muting occurs for the faulty frame. Alternatively, a prediction may also be performed. Here, a frame that is not to be corrected, and is thus faulty, is calculated from correctly received or corrected frames. Using suitable models, this may be estimated and thus predicted.

The check sum is constructed such that, for reasons of transmission efficiency, it may not recognize all errors that may occur. In such a case, the check sum fails. However, given one check sum a plurality of superposed errors may also mutually correct one another, so that in such a case, mistakenly, no errors are recognized using the check sum.

Characteristic for the check sum is the test of a bit sum, in which an examination of the content of the audio data, such as is performed in the method according to the present invention, is omitted.

Next there is a field for a bit allocation 3. In the case of DAB, as also in other digital transmission and recording modes, the audio signals are quantized. Here, a non-linear quantization is performed, based on a psychoacoustic quantization curve. Noises that are located in the vicinity, with respect to frequency, of a tone standing out from the sound spectrum are no longer perceived by the ear. This is referred to as the threshold of masking. It is possible to reduce the data rate by removing noises that are located below the masking threshold from the data. Here, the various subbands are also quantized with differing degrees of fineness, the fineness of the quantization is determined in that the quantization noise is still located below the masking threshold. From this differing quantization per subband, it results that a different number of bits are to be allocated per subband. For example, the bit allocation per subband fluctuates between 3 and 16 bits.

In the next field 4, a reference value selection is made. Throughout, it is found that chronologically successive reference values for a subband have the same, or at least very similar, size, because the power is approximately equal. It is therefore not necessary to transmit a plurality of reference values for the subband if one reference value represents a plurality of groups of sampling values that are chronologically separated from one another. In this field 4, it is now specified which reference values are to be used for which groups of sampling values for the denorming.

In field 5, the reference values themselves are then stored. In field 6, the actual audio data are stored, which are denormed using the reference values. In field 7, there are additional data including items of information that accompany the program, and above all the check sum for the reference values of the following frame.

Figure 2:
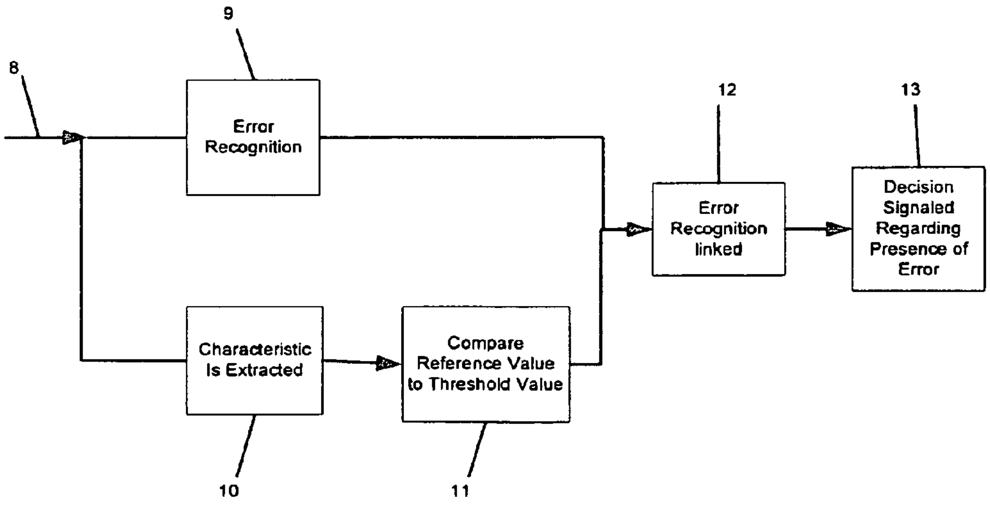
FIG. 2 illustrates a block switching diagram of the method according to the present invention.

In FIG. 2, a block switching diagram of the method according to the present invention is illustrated. The audio data are adjacent to an input 8. In block 9, an error recognition is performed on the reference values of the preceding frame. In block 10, from the current frame a characteristic is extracted in which the reference values of the preceding frame and of the current frame are subtracted from one another. If the sum is greater than a predetermined threshold value, then the difference is large enough that there is no correlation between the two reference values, which actually may not occur in the case of audio data. This case is therefore recognized as an error.

Alternatively, instead of a simple difference formation, a mean value formation may also be used, in order for example to calculate a standard deviation. If the standard deviation is greater than a predetermined threshold value, this is recognized as an error.

In block 11, a discriminator is present that compares the difference of the successive reference values with the predetermined threshold value, and makes a corresponding output; i.e., if an error is present, a bit is set to 1, and if no error is present this bit remains at 0. This bit is also called a flag.

In block 12, the error recognition from block 9 for the reference values and the error recognition by the characteristic analysis of block 11 are linked with one another, the method is fashioned such that block 11 uses the result of the previous frame; therefore, in block 9 as well the error recognition is performed for the reference value of the previous frame. Linking 12 is fashioned such that, by a logical OR gating, the decision as to whether an error is present is determined; i.e., here errors are signaled by a 1, and the absence of errors is signaled by a 0, so that both—the error recognition using a check sum and the characteristic analysis—may not indicate an error if no error is to be recognized.

If errors have been recognized, error correction or masking methods are now used. These include frame repetitions and a prediction.

In many subbands, in part no audio information is transmitted. Instead, a default value is entered. The difference formation of a default with another reference value may lead to an indication of an error. This default value must be characteristic; standardly it does not occur in the audio data, so that in this case the difference formation is omitted, and here only the error recognition for the reference values using the check sum is performed. That is, the flag for the error recognition of the reference values here remains at 0. Alternatively, the default value may also be fashioned such that the characteristic formed with the default value is always lower than the threshold value for the error recognition. In this manner, the default value is adapted to the reference values. In principle, the corresponding reference value may then also easily be taken, so that a difference image of zero results.

In block 13, the decision is signaled as to whether an error is present or not. If an error is present, stored reference values from a previous frame that was correctly transmitted are taken instead of the faulty reference value; if no error is present, all reference values from this frame are used.

Besides the scale factors named here as reference values, other data may also be used for this. These data include gain-factors, which are necessary per subband for the determination of an optimal modulation range, and which depend on the audio data. However, other data may be used for the method according to the present invention. The only precondition is the close correlation with the audio data.

What is claimed is:

1. A method for decoding digital audio data, comprising:

receiving digital audio data in at least one frame;

decoding the digital audio data, wherein during the decoding, scale factors are taken from the current and past frames in the decoding, which are dependent on the digital audio data, so as to generate a characteristic with the aid of the scale factors;

comparing the characteristic with a predetermined threshold value; and indicating a first error detection by a signaling when the characteristic lies above the predetermined threshold value, wherein the characteristic is generated using a mean value formation by the scale factor having at least one preceding scale factor and a second error detection is performed on the scale factors using a checksum and the first and the second error detection are connected using a logical OR operation in order to detect an error.

2. The method according to claim 1, wherein the digital audio data are subdivided into successive subbands, the digital audio data for each subband being denormed using at least one reference value for the respective subband, and wherein the at least one reference value for the respective subband is compared with at least one preceding reference value for the respective subband to produce the characteristic.

3. The method according to claim 2, wherein the signaling is indicated by a bit sequence as a flag.

4. The method according to claim 3, wherein the bit sequence is compared with a frame for the error recognition.

5. The method according to claim 4, wherein the error recognition is performed for each frame.

6. The method according to claim 5, wherein the at least one frame has a frame head, a field for the error recognition of the at least one frame, a field for a bit allocation, a field for a selection of the reference values, a field for the reference values, a field for the digital audio data, and an additional data field.

7. The method according to claim 6, wherein the additional data field has data for the error recognition for the reference values.

8. The method according to claim 7, wherein an MPEG-1 layer II frame is used as the at least one frame.

9. The method according to claim 2, wherein if, in the at least one subband, a default value is entered as the at least one reference value, the default value is not subjected to comparison with the at least one preceding reference value.

10. The method according to claim 9, wherein the default value is chosen such that the comparison with the at least one preceding reference value results in the characteristic to lie under the predetermined threshold value.

* * * * *